United States Patent
Chang et al.

(10) Patent No.: US 9,666,715 B2
(45) Date of Patent: May 30, 2017

(54) FINFET TRANSISTOR WITH EPITAXIAL STRUCTURES

(71) Applicant: UNITED MICROELECTRONICS CORP., Hsin-Chu (TW)

(72) Inventors: Chung-Fu Chang, Tainan (TW); Chun-Hsien Lin, Tainan (TW); Chen-Yi Weng, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/599,556

(22) Filed: Jan. 19, 2015

(65) Prior Publication Data

US 2016/0172496 A1    Jun. 16, 2016

(30) Foreign Application Priority Data

Dec. 12, 2014    (TW) .............................. 103143557 A

(51) Int. Cl.
*H01L 29/78*    (2006.01)
*H01L 29/66*    (2006.01)

(52) U.S. Cl.
CPC .... *H01L 29/7848* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,530,317 B1 * | 9/2013 | Wu | H01L 29/4232 257/314 |
| 2004/0259340 A1 * | 12/2004 | Chu | H01L 21/28114 438/585 |
| 2007/0001219 A1 * | 1/2007 | Radosavljevic | H01L 29/41791 257/327 |
| 2011/0287611 A1 * | 11/2011 | Cheng | H01L 21/02532 438/478 |
| 2013/0087856 A1 * | 4/2013 | Ortolland | H01L 21/28088 257/365 |
| 2013/0198695 A1 | 8/2013 | Bryant | |
| 2014/0183599 A1 * | 7/2014 | Hong | H01L 29/785 257/190 |

* cited by examiner

*Primary Examiner* — Calvin Choi
*Assistant Examiner* — Xiaoming Liu
(74) *Attorney, Agent, or Firm* — Winston Hsu; Scott Margo

(57) ABSTRACT

A field effect transistor with epitaxial structures includes a fin-shaped structure and a metal gate across the fin-shaped structure. The metal gate includes a pair of recess regions disposed on two sides of the bottom of the metal gate.

13 Claims, 5 Drawing Sheets

FINFET TRANSISTOR WITH EPITAXIAL STRUCTURES

BACKGROUND OF THE INVENTION

1. Field of the Invention

The present invention relates generally to a field effect transistor, and more particularly to a field effect transistor with epitaxial structures.

2. Description of the Prior Art

With the trend in the industry being towards scaling down the size of metal oxide semiconductor transistors (MOS), three-dimensional or non-planar transistor technology, such as the fin field effect transistor technology (FinFET) has been developed to replace planar MOS transistors. The three-dimensional structure of a FinFET increases the overlapping area between the gate and the fin-shaped structure of the silicon substrate, and, accordingly, the channel region is more effectively controlled. The drain-induced barrier lowering (DIBL) effect and short channel effect (SCE) are therefore reduced. The channel region is also longer under the same gate length, and thus the current between the source and the drain is increased.

In another aspect, in order to further improve the devices performances, a strained-silicon technology has also been developed. The main principle in the strained-silicon technology is that strains are applied to predetermined regions within the field effect transistor which in turn make the field effect transistor work better by enabling charge carriers, such as electrons or holes, to pass through the lattice of the channel more easily. In detail, one main technology generally used in the strained-silicon technology is to dispose epitaxial structures with lattice constants different from that of the crystal silicon in the source/drain regions of the field effect transistors. The epitaxial structures are preferably composed of silicon germanium (SiGe), silicon phosphorous (SiP) and so forth, which have lattice constants different from that of the crystal silicon. Since the epitaxial structures have lattice constants larger or smaller than that of the crystal silicon, carrier channel regions adjacent to those epitaxial structures could sense external stresses and both the lattice structure and the band structure within these regions are altered. As a result, the carrier mobility and the performances of the corresponding field effect transistors are improved effectively. Additionally, because the epitaxial structures are generally disposed in the source/drain regions of the field effect transistors, and the surface areas of the epitaxial structures are often greater than those of the underneath fin-shaped structure, the epitaxial structures can therefore reduce the contact resistance between the source/drain regions and the corresponding contact plugs.

However, along with the continuous decrease in the size and dimensions of the field effect transistors, there are still some newly generated technological problems that need to be overcome, even though the non-planar transistor and the strained-silicon technology are already adopted. For example, for a field effect transistor fabricated through a replacement metal gate process, recesses used to receive epitaxial structures are often formed before the formation of the epitaxial structures and disposed in a fin-shaped structure at two sides of a dummy gate structure. However, because the recesses are formed by etching the fin-shaped structure, spacers disposed on two sides of the bottom of the dummy gate structure are often etched concurrently during this etching process. Accordingly, the epitaxial structures formed in the subsequent process may penetrate the spacers and directly contact with a dummy gate electrode of the dummy gate structure. In this situation, the epitaxial structures are inevitably electrically connected to the metal gate structure when the corresponding replacement metal gate process is completed, and the performance of the field effect transistor is worsened.

SUMMARY OF THE INVENTION

To this end, there is still a need to provide an improved field effect transistor which can overcome the above-mentioned technical drawbacks.

According to one embodiment of the present invention, a field effect transistor with epitaxial structures is provided, which includes a fin-shaped structure and a metal gate across the fin-shaped structure. The metal gate includes a pair of recess regions disposed on two sides of the bottom of the metal gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
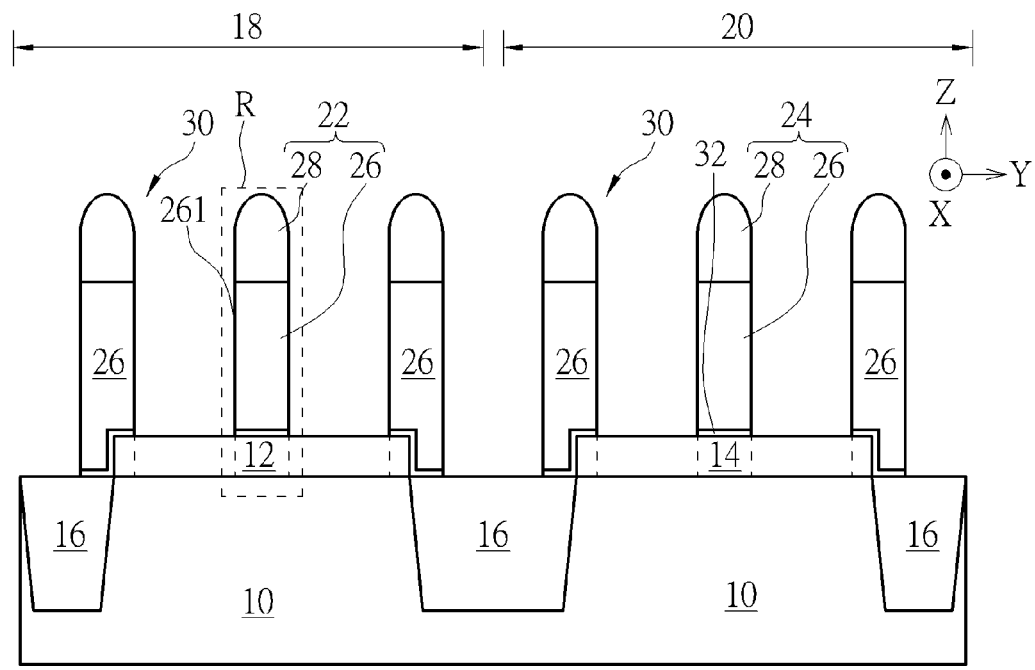
FIGS. 1-10 illustrate a method for fabricating FinFET according to a preferred embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

As shown in FIG. 1, a substrate 10, such as a silicon substrate or a silicon-on-insulator (SOI) substrate is provided. A first transistor region 18, such as a PMOS region and a second transistor region 20, such as a NMOS region are defined on the substrate 10. At least a first fin-shaped structure 12, at least a second fin-shaped structure 14, and an insulating layer 16 are formed on the substrate 10. The bottom of the fin-shapes structures 12, 14 is preferably enclosed by the insulating layer 16, such as silicon oxide to form a shallow trench isolation (STI). A first gate 22 and a second gate 24 are formed on part of the first fin-shaped structure 12 and the second fin-shaped structure 14 respectively. Each of the first gate 22 and the second gate structure 24 includes a gate electrode 26 and a hard mask 28 disposed on the gate electrode 26. In the transistor device formed afterwards, the regions of the fin-shaped structures 12, 14 overlapped by the gate electrodes 26 could be used as a channel for carrier flow. At least two parallel channel regions are formed in each of the fin-shaped structures 12, 14, and the channel lengths of the channel regions are substantially the same.

The formation of the first fin-shaped structure 12 and the second fin-shaped structure 14 could include first forming a patterned mask (not shown) on the substrate, 10, and an etching process is performed to transfer the pattern of the patterned mask to the substrate 10. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structures 12, 14. Alternatively, the formation of the first fin-shaped structure 12 and the second fin-shaped structure 14 could also be accomplished by first forming a patterned hard mask (not shown) on the substrate 10, and then performing an epitaxial process on the exposed substrate 10 through the patterned hard mask to grow a semiconductor layer. This semiconductor layer could then be used as the corresponding fin-shaped structures 12, 14. In another fashion, the patterned hard mask could be removed selectively or retained, and deposition, CMP, and then etching back could be used to form an insulating layer 16 to surround the bottom of the fin-shaped structures 12, 14. Moreover, if the substrate 10 is a SOI substrate, a patterned mask could be used to etch a semiconductor layer on the substrate until reaching a bottom oxide layer underneath the semiconductor layer to form the corresponding fin-shaped structures. If this means is chosen the aforementioned steps for fabricating the insulating layer 16 could be eliminated.

Preferably a gate dielectric layer 32 is formed between the gate electrodes 26 and the fin-shaped structures 12, 14. The gate electrodes 26 preferably consist of doped or non-doped polysilicon, but could also be selected from a material consisting of silicide of metals. The gate dielectric layer 32 preferably consists of a silicon layer, such as $SiO_x$, $SiN_x$, or SiON, but could also be selected from dielectric materials having high-k dielectric properties.

Figure 2:
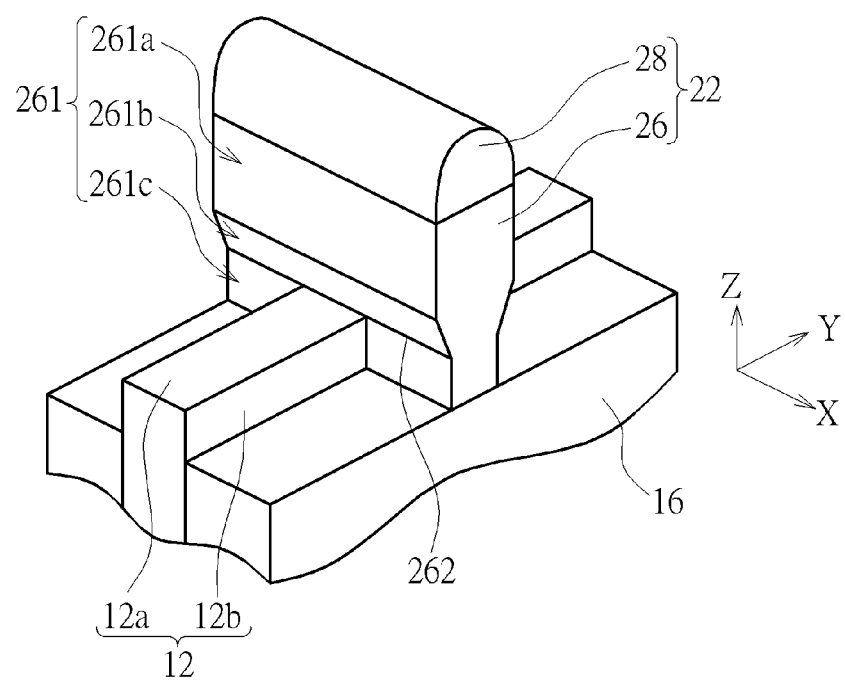

Afterwards, an over etching process is carried out to etch two sidewalls 261 of each gate electrodes 26 and thereby form recess regions in the bottom sidewalls of the gate electrodes 26. When the over etching process is finished, the fin-shaped structures 12, 14 originally covered by the gate electrodes 26 can be exposed so as to obtain the structure shown in FIG. 2. FIG. 2 is a perspective diagram showing an enlarged structure of region R in FIG. 1. In this processing stage, the sidewall 261 of the gate electrode 26, from its bottom to its top, may include: a lower vertical region 261c, a slanted region 261b, and an upper vertical region 261a. Specifically, the lower vertical region 261c, the slanted region 261b, and the upper vertical region 261a are along a first axis X. Moreover, the lower vertical region 261c and the upper vertical region 261a are vertical surfaces, and the slanted region 261b is an outwardly slanted surface from its bottom to its top. That is to say, the width of each gate electrode 26, which is parallel to the second axis Y, is gradually increased from the bottom to the top of the gate electrode 26 along the third axis Z. Additionally, there is a boundary 262 between the lower vertical region 261c and the slanted region 261b, which preferably aligns with a top side 12a of the fin-shaped structure 12. Also, in this processing stage, the lateral side 12b of the fin-shaped structure 12 are still partially covered by the gate electrode 26 rather than fully exposed from the gate electrode 26.

Next, a first hard mask (not shown) is formed entirely in the first transistor region 18 and the second transistor region 20 to cover the first gate 22, the second gate 24, the fin-shaped structures 12, 14, and the insulating layer 16.

According to a preferred embodiment of the present invention, the first hard mask is selected from a group consisting of SiC, SiON, SiN, SiCN, and SiBN, but not limited thereto.

Figure 3:
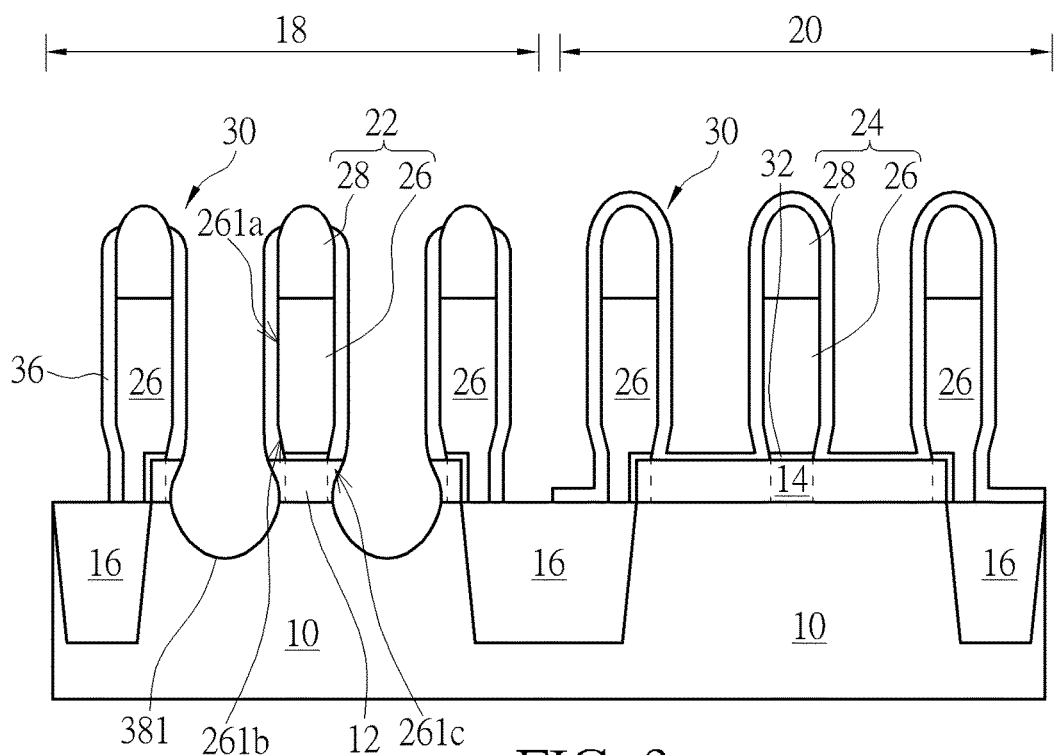

As shown in FIG. 3, a patterned resist (not shown) is formed in the second transistor region 20, and a portion of the first hard mask in the first transistor region 18 is removed by using the patterned resist as a mask to form a first spacer 36 around the first gate 22 and a first recess 381 in the first fin-shaped structure 12 adjacent to the first gate 22.

Figure 4:
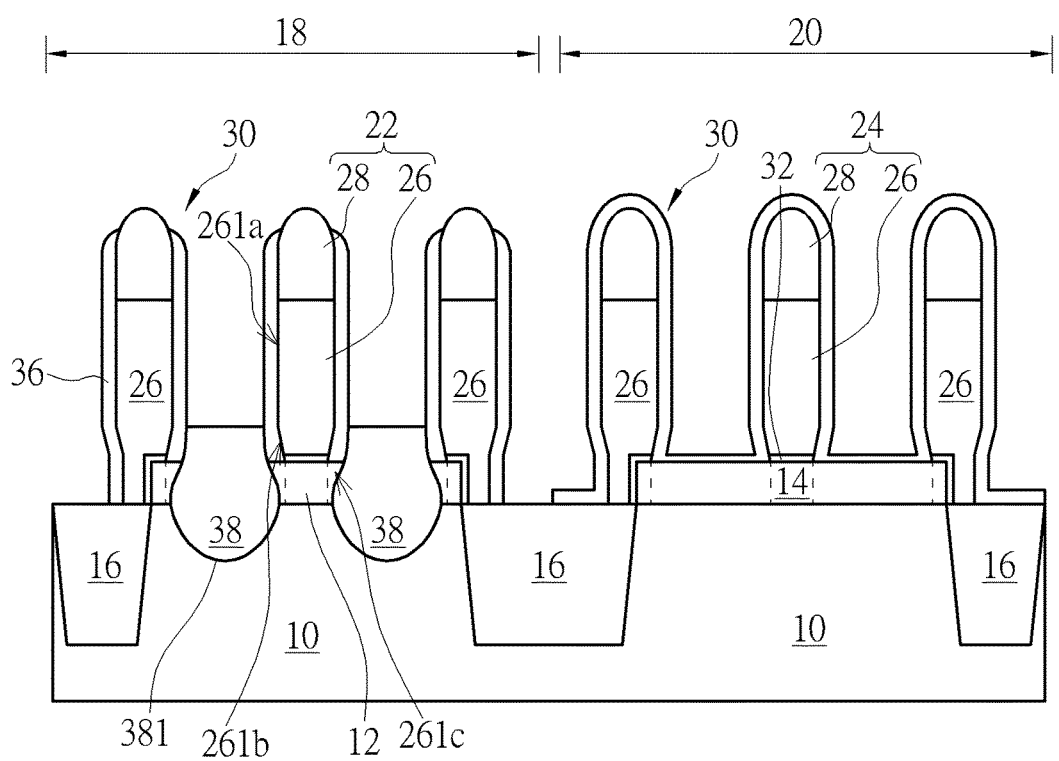

As shown in FIG. 4, the pattered photoresist in the second transistor region 20 is stripped, and a selective epitaxial growth process is carried out to thereby form first epitaxial layers 38 in the first recesses 381 on two sides of the first gate 22. Preferably, the first epitaxial layers 38 are made of silicon germanium or other materials with lattice constants greater than those of the underneath fin-shaped structure 12. Because the first spacer 36 can conformally cover the upper vertical region 261a, the slanted region 261b, and the lower vertical region 261c of the gate sidewall, the first spacer 36 covering the lower vertical region 261c is therefore more inward than the first spacer 36 covering the upper vertical region 261a. Because of the design of the contour of the first spacer 36, the first spacer 36 covering the lower vertical region 261c would not be etched by the etchants during forming the first recess 381, which can ensure that gate electrode 26 is fully protected by the first spacer 36. In other words, the first spacer 36 can separate the first epitaxial layer 38 from the sidewall 261 of the gate electrode, and the first epitaxial layer 38 is not in direct contact with the sidewall 261 of the gate electrode. Also, because the first spacer 36 covering the lower vertical region 261c is more inward compared with a conventional vertical spacer, the corresponding epitaxial layer 38 can be formed in a relatively large space. In other words, the top side, lateral side and/or bottom side of the first epitaxial layer 38 may be convex, and the first epitaxial layer 38 is preferably like a sphere.

Next, a second hard mask 40 is formed entirely in the first transistor region 18 and the second transistor region 20 to cover the first gate 22 and the second gate 24. According to a preferred embodiment of the present invention, the second hard mask 40 is selected from a group consisting of SiC, SiON, SiN, SiCN, and SiBN, but not limited thereto.

Figure 5:
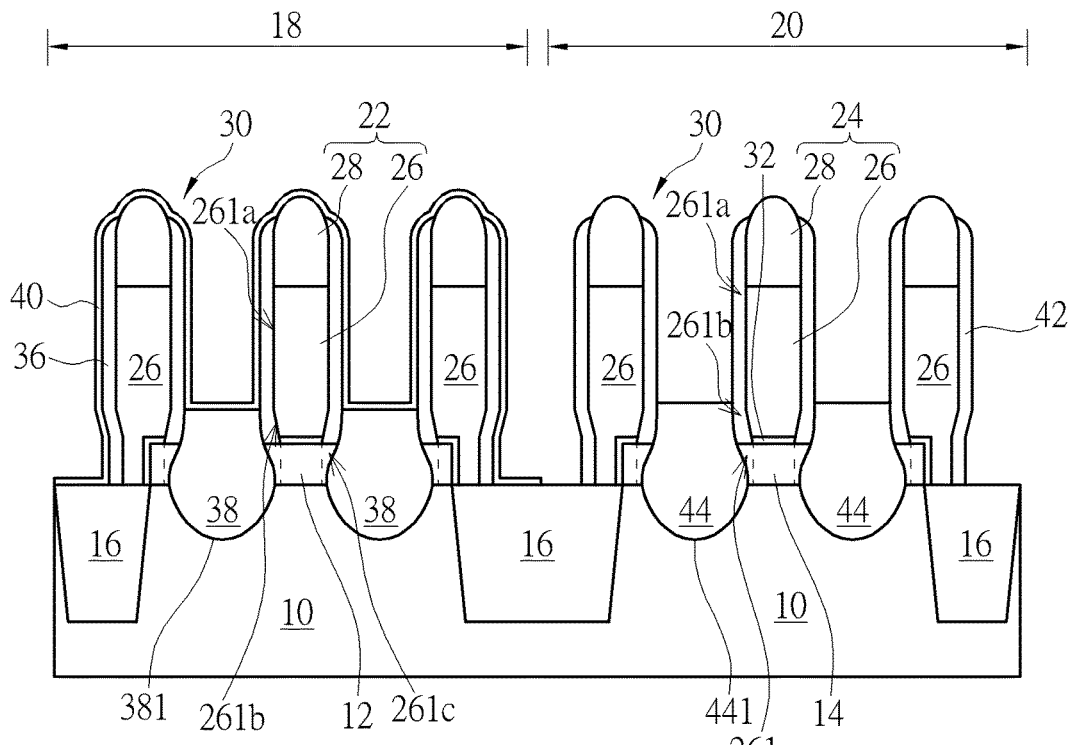

Next, as shown in FIG. 5, a patterned resist (not shown) is formed in the first transistor region 18, and the second hard mask 40 in the second transistor region 20 is completely removed by using the patterned resist as a mask. In this processing stage, the second hard mask 40 is still retained in the first transistor region 18. Afterwards, the first hard mask in the second transistor region 20 may be further etched. In this way, another first spacer 42 around the second gate 24 and a second recess 441 in the second fin-shaped structure 14 adjacent to the second gate 24 are formed.

Analogous to the gate electrode 26 and the first epitaxial layer 44 in the first transistor region 18, the sidewall 261 of the gate electrode 26 in the second transistor region 20, from its bottom to its top, may include: a lower vertical region 261c, a slanted region 261b, and an upper vertical region 261a. Specifically, the lower vertical region 261c and the upper vertical region 261a are vertical surfaces, and the slanted region 261b is an outwardly slanted surface along a direction from the bottom to the top of the gate electrode 26. Also, in this processing stage, the lateral side of the fin-shaped structure 14 are still partially covered by the gate electrode 26 rather than fully exposed from the gate electrode 26.

Afterwards, the pattered photoresist in the first transistor region 18 is stripped, and a selective epitaxial growth process is carried out to thereby form second epitaxial layers 44 in the second recesses 441 on two sides of the second gate 24. Preferably, the second epitaxial layers 38 are made of silicon phosphorous or other materials with lattice constants less than those of the underneath fin-shaped structure 14. Also, the second epitaxial layer 44 would not be formed on the top side of the first epitaxial layer 38 during forming the second epitaxial layer 44 because the top side of the first epitaxial layer 38 is covered by the second hard mask 40.

Besides, because the first spacer 42 can conformally cover the upper vertical region 261a, the slanted region 261b and the lower vertical region 261c of the gate sidewall, the first spacer 42 covering the lower vertical region 261c is therefore more inward than the first spacer 42 covering the upper vertical region 261a. Because of the design of the contour of the first spacer 42, the first spacer 42 covering the lower vertical region 261c would not be etched by the etchants during the formation of the second recess 441, which can ensure that gate electrode 26 is fully protected by the first spacer 42. In other words, the first spacer 42 can separate the second epitaxial layer 44 from the sidewall 261 of the gate electrode, and the second epitaxial layer 44 is not in direct contact with the sidewall 261 of the gate electrode. Also, because the first spacer 42 covering the lower vertical region 261c is more inward compared with a conventional vertical spacer, the corresponding second epitaxial layer 44 can be formed in a relatively large space. In other words, the top side, lateral side and/or bottom side of the second epitaxial layer 44 may be convex, and the second epitaxial layer 44 is preferably like a sphere.

Figure 6:
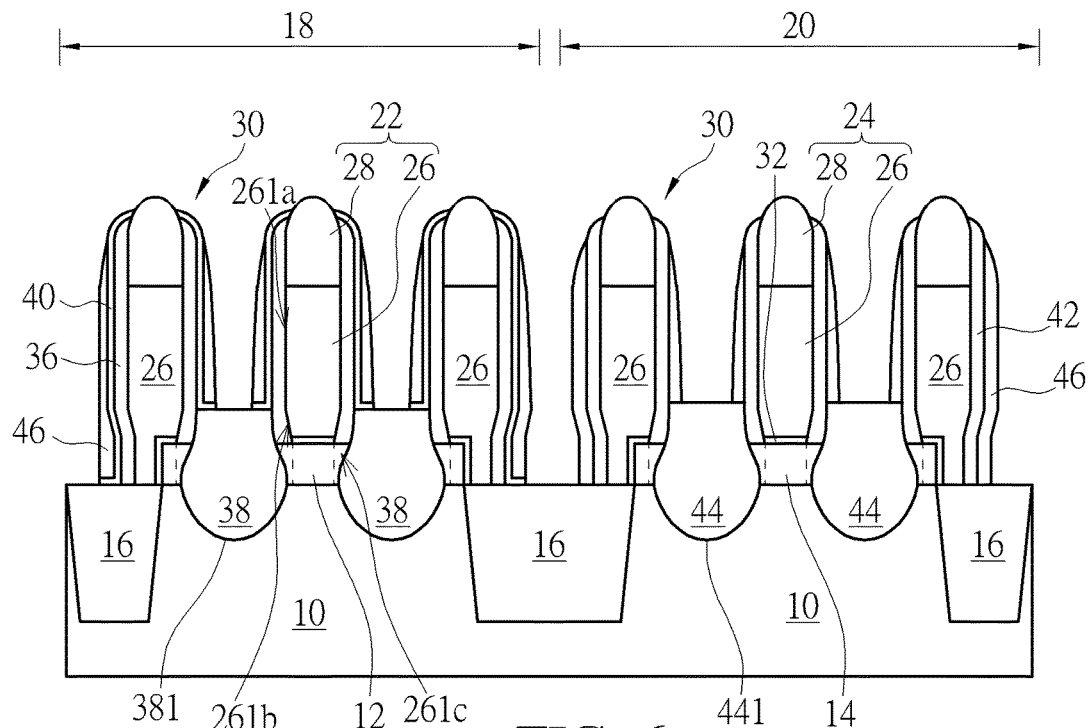

Next, as shown in FIG. 6, a second spacer 46 is formed around the first gate 22 and the second gate 24, and the second hard mask 40 on the top of the first epitaxial layer 38 is concurrently removed. The steps for forming the second spacer 46 could be similar to the aforementioned process for forming the first spacers 36, 42 and the details of which are not described herein for the sake of brevity. It should be noted that even if a second spacer 46 is formed directly on the sidewall of the first spacers 36, 42, the first spacers 36, 42 could also be removed before the formation of the second spacer 46. This approach is also within the scope of the present invention.

Figure 7:
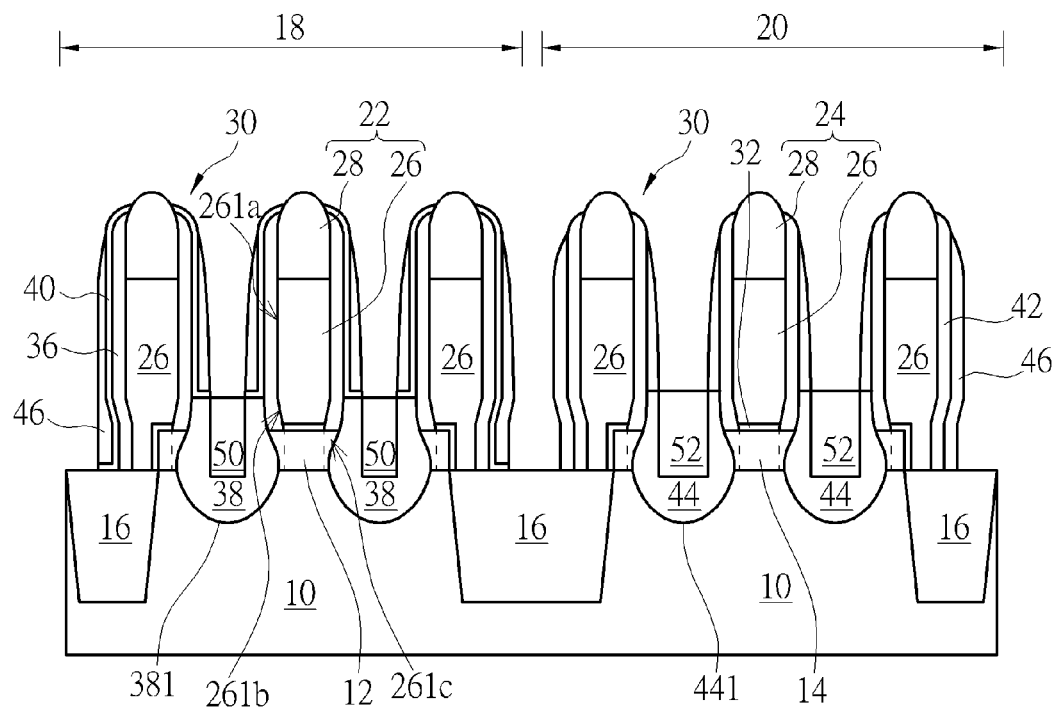

Next, as shown in FIG. 7, an ion implantation is performed to form source/drain regions in the first transistor region 18 and the second transistor region 20. For instance, a patterned resist (not shown) could be covered on the second transistor region 20, and a p-type ion implantation is conducted in the first transistor region 18 to form a source/drain region 50 in the first epitaxial layer 38 adjacent to the first gate structure 22. After stripping the patterned resist from the second transistor region 20, another patterned resist (not shown) is formed on the first transistor region 18 and an n-type ion implantation is performed in the second transistor region 20 to forma source/drain region 52 in the second epitaxial layer 44 adjacent to the second gate structures 24. The patterned resist in the first transistor region 18 is then stripped thereafter.

Figure 8:
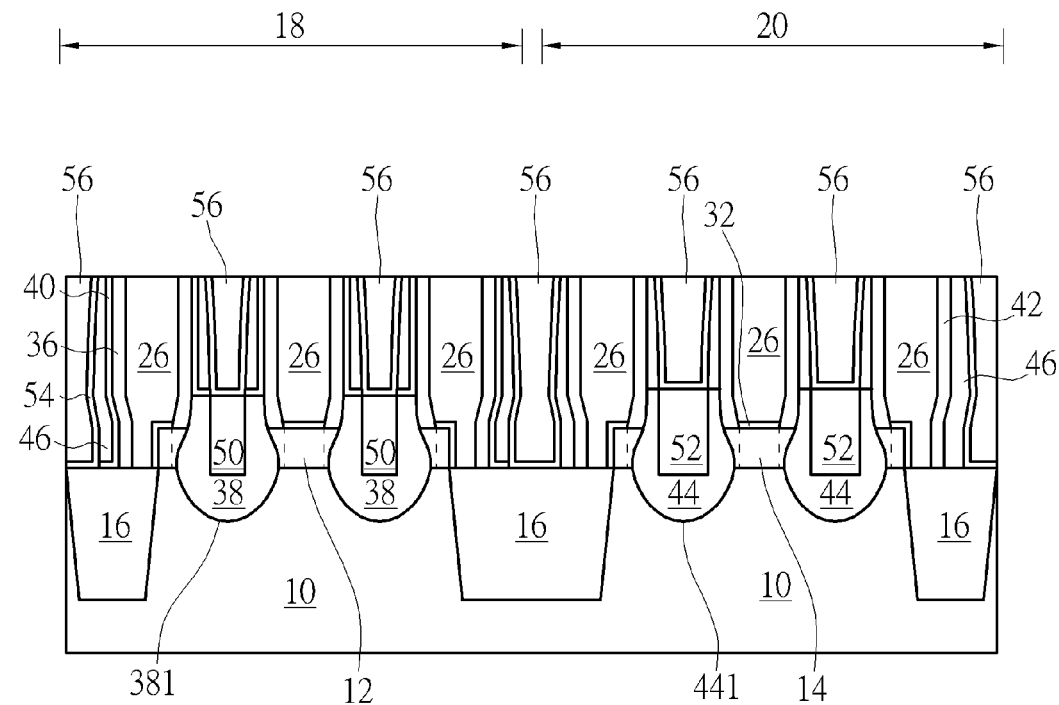

Next, as shown in FIG. 8, a contact etch stop layer (CESL) 54 is deposited on the first gate 22, second gate 24, and second spacer 46 of the first transistor region 18 and the second transistor region 20. Next, a flowable chemical vapor deposition, FCVD) is carried out to form an interlayer dielectric (ILD) layer 56 on the CESL 54. A planarizing process, such as a chemical mechanical polishing (CMP) process is performed to partially remove the ILD layer 56, CESL 54, and hard mask 28 so that the top of the gate electrode 26 composed of polysilicon within the first gate 22 and the second gate 24 is exposed and substantially even with the surface of the ILD layer 56.

Figure 9:
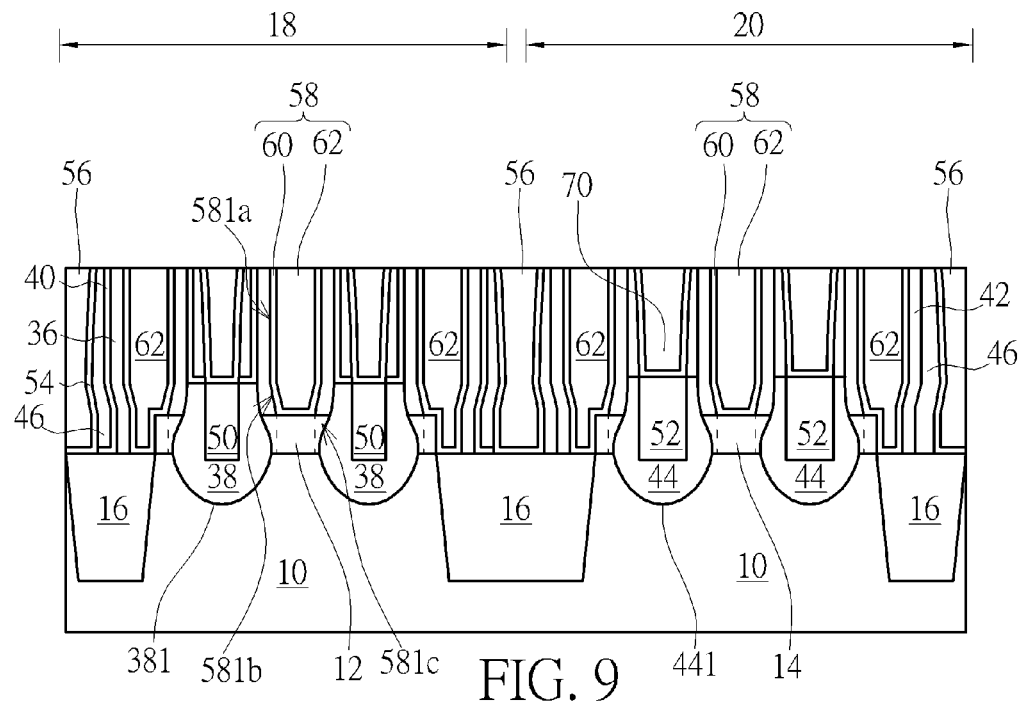

Next, as shown in FIG. 9, a replacement metal gate (RMG) process is conducted to form a metal gate 58 in each of the first transistor region 18 and the second transistor region 20. The RMG process may include the following processes. First, the gate electrodes 26 in the first transistor region 18 and the second transistor region 20 are removed so as to leave trenches (not shown) in the ILD layer 56. Afterwards, a high-k dielectric layer 60, a work function metal layer (not shown), and a gate metal layer 62 are sequentially filled into the trenches to form metal gates 58. Furthermore, because each trench formed by removing the gate electrode 26 may have a gradually increasing cross-sectional area from the bottom to the top of the trench, the high-k dielectric layer 60, the work function metal layer, and the gate metal layer 62 may be filled into the bottom of the trench more easily, which avoid the formation of void defects in the metal gate. Moreover, because the bottom width of the metal gate 58 is less than the top width of the metal gate 58, which is used to define the channel length of the corresponding carrier channel, the metal gate disclosed by the present embodiment may define channel length shorter than a conventional metal gate does.

According to a preferred embodiment of the present invention, RMG process includes approaches such as gate first process, high-k first process from gate last process, high-k last process from gate last process, or polysilicon gate process. The present embodiment is preferably accomplished by the employment of high-k last process from the gate last process, hence the high-k dielectric layer 60 preferably has a "U-shaped" cross section, and the high-k dielectric layer 60 could be made of dielectric materials having a dielectric constant (k value) larger than 4. The material of the high-k dielectric layer 60 may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The work function metal layer is formed for tuning the work function of the later formed metal gates 58 to be appropriate in an NMOS or a PMOS. For an NMOS transistor, the work function metal layer 62 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. Furthermore, the material of the metal gate layer 62 may include copper (Cu), aluminum (Al), titanium aluminum (TiAl), cobalt tungsten phosphide (CoWP) or any combination thereof.

Figure 10:
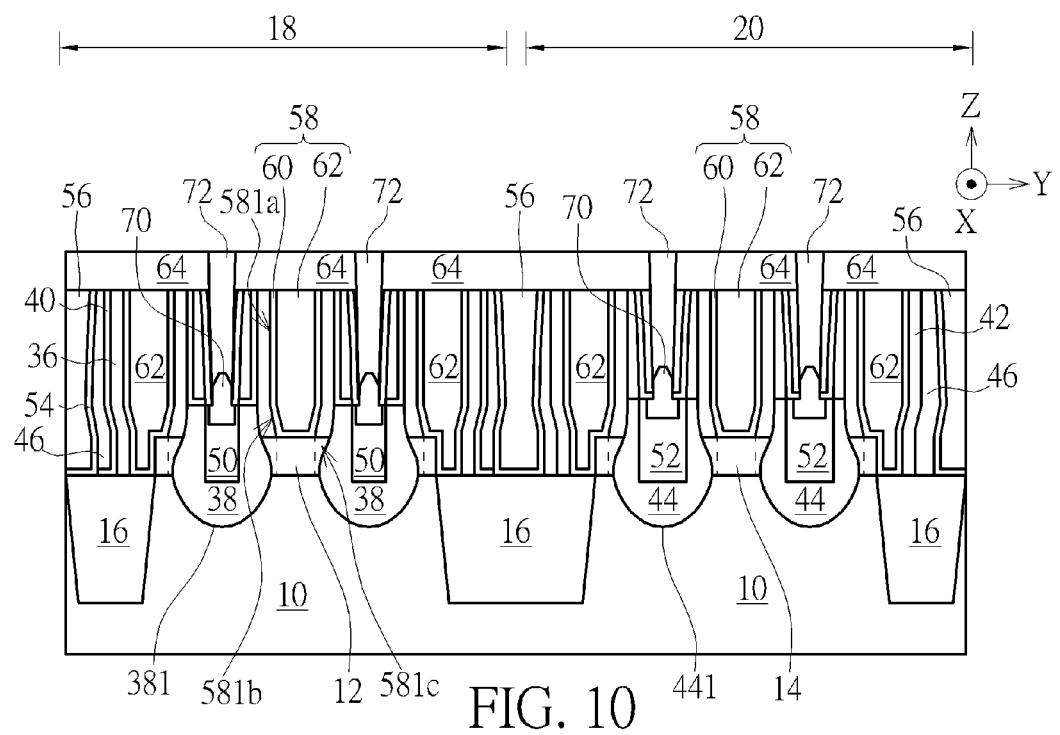

Next, as shown in FIG. 10, a cap film 64 is covered on the metal gates 58, in which the cap film 64 is preferably composed of oxides, but not limited thereto. A one-photo-one-etching (1P1E) or two-photo-two-etching (2P2E) process is then conducted to form a plurality of openings, such as contact holes (not shown) in the cap film 64 and the ILD layer 56 to expose the first epitaxial layer 38 and the second epitaxial layer 44.

Next, a salicide process is performed, such as by first depositing a metal layer (not shown) consisting of cobalt (Co), titanium (Ti), and/or nickel (Ni), or nickel platinum alloy (NiPt) into the contact holes, and a rapid thermal anneal (RTA) process is conducted to react the metal layer with silicon cap 68 for forming a silicide layer 70.

Next, as shown in FIG. 10, contact plugs 72 are further formed in the contact holes. The steps of forming the contact plugs 72 are described below. First, a barrier/adhesive layer (not shown), a seed layer (not shown) and a conductive layer (not shown) are sequentially formed to cover the cap film 64 and fill the contact holes, in which the barrier/adhesive layer are formed conformally along the surfaces of the contact holes, and the conductive layer is filled completely into the contact holes. The barrier/adhesive layer could be used for preventing metal elements of the conductive layer from diffusing into the neighboring cap film 64, and also increase the adhesiveness between the conductive layer and the cap film 64. The barrier/adhesive layer may consist of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and more preferably tungsten, which can form suitable Ohmic contact between the conductive layer and the metal silicide layer 70 or between the conductive layer and the source/drain regions 50, 52 underneath. Then, a planarization step, such as a chemical mechanical polish (CMP) process or an etching back process or combination thereof, can be performed to remove the barrier/adhesive layer, the seed layer and the conductive layer outside the contact holes 66, so that a top surface of a remaining conductive layer and the top surface of the cap film 64 are coplanar, thereby forming a plurality of contact plugs 72 and completing the fabrication of a FinFET according to a preferred embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A field effect transistor with epitaxial structures, comprising:
    a fin-shaped structure extending along a first direction, disposed on a semiconductor substrate; and
    a metal gate across the fin-shaped structure, wherein the metal gate comprises a pair of recess regions respectively disposed on two sides of a bottom of a lower part of the metal gate, wherein each of the recess regions comprises a vertical region and a slanted region sequentially arranged from a bottom to a top of the recess regions, and a boundary between the vertical region and the slanted region of the recess region aligns with a top surface of the fin-shaped structure, and an upper part of the metal gate and a lower part of the metal gate respectively have a width along the first direction, the width of the upper part of the metal gate greater than the width of the lower part of the metal gate between the pair of the recess regions.

2. The field effect transistor of claim 1, wherein the metal gate overlaps portions of the fin-shaped structure.

3. The field effect transistor of claim 1, wherein the metal gate further comprises another vertical region disposed on the slanted region.

4. The field effect transistor of claim 1, the field effect transistor further comprises a spacer conformally covering the vertical region and the slanted region.

5. The field effect transistor of claim 4, wherein the spacer covering the vertical region is more inward than the spacer covering the slanted region.

6. The field effect transistor of claim 1, wherein the metal gate, the vertical region, and the slanted region are along a first axis.

7. The field effect transistor of claim 1, further comprising two epitaxial structures, respectively disposed on two sides of the metal gate, wherein portions of the epitaxial structures are respectively disposed in the recess regions.

8. The field effect transistor of claim 7, wherein a top side of each of the epitaxial structures is convex.

9. The field effect transistor of claim 7, wherein a bottom side and a lateral side of each of the epitaxial structures are convex.

10. The field effect transistor of claim 7, wherein each of the epitaxial structures is a sphere-like structure.

11. The field effect transistor of claim 1, further comprising at least two parallel channel regions in the fin-shaped structure, wherein channel lengths of the channel regions are substantially the same.

12. The field effect transistor of claim 1, wherein the transistor further comprises a spacer conformally covering the metal gate.

13. The field effect transistor of claim 1, wherein the metal gate comprises a gate dielectric layer, a work function metal layer, and a gate metal layer stacked from the bottom to the top of the metal gate.

* * * * *